United States Patent
Chang et al.

(10) Patent No.: US 10,175,280 B2
(45) Date of Patent: Jan. 8, 2019

(54) ELECTRONIC DEVICE TEST SYSTEM AND METHOD THEREOF

(71) Applicant: Primax Electronics Ltd., Taipei (TW)

(72) Inventors: Pei-Ming Chang, Taipei (TW); Shih-Chieh Hsu, Taipei (TW); Shi-Jie Zhang, Taipei (TW); Wei-Lung Huang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 75 days.

(21) Appl. No.: 15/627,131

(22) Filed: Jun. 19, 2017

(65) Prior Publication Data

US 2018/0210021 A1 Jul. 26, 2018

(30) Foreign Application Priority Data

Jan. 25, 2017 (TW) .............................. 106102950 A

(51) Int. Cl.
*G01R 31/36* (2006.01)
*G01R 31/02* (2006.01)
*G01R 31/28* (2006.01)

(52) U.S. Cl.
CPC ......... *G01R 31/02* (2013.01); *G01R 31/2834* (2013.01)

(58) Field of Classification Search
CPC ... G06F 19/00; G06F 3/0484; G06K 7/10722; G06K 7/10831; G06K 19/06028; G06K 7/10732; G06K 7/10792; G06K 7/10821; G06K 7/10861; G06K 7/1404; G06K 7/1417; G06K 9/2036; H04N 5/2351; H04N 5/2354; H04N 13/254; H04N 1/00734; H04N 2201/0081; H04N 5/23238; H04N 5/2327; H04N 7/147; G01N 2021/6434; G01N 2021/6484; G01R 31/02; G01R 31/2834
See application file for complete search history.

(56) References Cited

U.S. PATENT DOCUMENTS

| | | | | |
|---|---|---|---|---|
| 7,863,890 | B2 * | 1/2011 | Sleijpen | G01R 31/2886 324/750.01 |
| 8,235,292 | B2 * | 8/2012 | Talboys | H01R 13/641 235/375 |
| 8,344,685 | B2 * | 1/2013 | Bertness | G06Q 99/00 320/104 |
| 2016/0076992 | A1 * | 3/2016 | Gillespie | G01N 21/01 356/244 |
| 2016/0216284 | A1 * | 7/2016 | Misener | G01N 35/00029 |

\* cited by examiner

*Primary Examiner* — Vinh Nguyen
(74) *Attorney, Agent, or Firm* — Kirton McConkie; Evan R. Witt

(57) ABSTRACT

An electronic device test system is configured to test functions of an electronic device. The electronic device test system includes: a test computer, configured to execute an electronic device test program; a scanning device, configured to scan a barcode number of the electronic device; and an optical sensor module, configured to detect a connection status of the electronic device and the test computer. When the optical sensor module confirms the connection status, the electronic device test program starts a test function to test the electronic device, records a test result of the electronic device according to the barcode number, and subsequently generates a retest rate according to the test result.

9 Claims, 4 Drawing Sheets

ELECTRONIC DEVICE TEST SYSTEM AND METHOD THEREOF

FIELD OF THE INVENTION

The present invention relates to the field of electronic device test and application, and in particular, to an electronic device test system having connection confirmation and method thereof.

BACKGROUND OF THE INVENTION

Electronic devices and their related products have become an indispensable part of human society. Billions of electronic products are sold worldwide per year, including: notebook computers, tablet computers, personal digital assistants, mobile phones, and the like. However, with the increase in mass consumption and the progress of science and technology, a speed of replacing old electronic products with new ones becomes faster and faster. Consequently, electronic wastes generated by such replacement also cause a great damage to the global environment.

To reduce a total quantity of the electronic wastes, in an aspect of a consumer, functionality and diversity of an electronic product may be increased to reduce the speed of replacing the electronic product by the consumer. In an aspect of production, a test system on a production line is utilized to test each function of an electronic device, so as to increase a yield rate of the electronic device, and prolong the service life of the electronic device.

In a conventional test system, after creating a barcode number of the electronic device, the test system can start a test function within a preset period of time to test the electronic device. However, if the electronic device is not correctly connected to the test system in this case, the test system may easily make a misjudgment. Consequently, the electronic device having normal functions is determined as a faulty product, and the electronic device having normal functions becomes an electronic waste and is discarded. In addition, if a functional status of a suspected faulty product is confirmed for the second time, the frequency of retesting the electronic device by the test system is increased. Consequently, more energy and manpower costs are consumed, and operational performance of a production line cannot be precisely controlled.

In view of this, how to provide an electronic device test system having connection confirmation and how to precisely control operational performance of a production line are technical topics to be resolved by the present invention.

SUMMARY OF THE INVENTION

A primary objective of the present invention is to provide an electronic device test system having connection confirmation, so as to avoid an erroneous test result of an electronic device that is to be tested and is not correctly connected to a test computer, and utilize a test result to calculate and generate a retest rate and a first pass yield, thereby precisely controlling operational performance of each production line or test station.

To achieve the foregoing objective, the present invention provides an electronic device test system, configured to test functions of an electronic device. The electronic device test system includes:

a test computer, configured to execute an electronic device test program;

a scanning device, configured to scan a barcode number of the electronic device; and an optical sensor module, configured to detect a connection status of the electronic device and the test computer, where when the optical sensor module confirms the connection status, the electronic device test program starts a test function to test the electronic device, records a test result of the electronic device according to the barcode number, and subsequently generates a retest rate according to the test result.

In the foregoing preferable implementation manner, the electronic device test system further includes a display device, configured to display a human-machine interface of the electronic device test program.

In the foregoing preferable implementation manner, the optical sensor module includes a light emitting element and a light receiving element.

In the foregoing preferable implementation manner, the light emitting element further includes a mask, configured to maintain a traveling direction of a light ray emitted by the light emitting element.

In the foregoing preferable implementation manner, the light receiving element is a photo transistor or an optical resistor.

In the foregoing preferable implementation manner, the electronic device has a universal serial bus interface connection port.

In the foregoing preferable implementation manner, the electronic device is: a notebook computer, a tablet computer, a personal digital assistant, a mobile phone, a watch, a game console, a mouse, a keyboard, a screen, a printer, an office machine, a scanner, or a camera.

Another preferable practice of the present invention relates to an electronic device test method, used to test functions of an electronic device. The electronic device test method includes the following steps:

(a) scanning a barcode number of the electronic device;

(b) confirming, by using an optical sensor module, whether the electronic device is connected to a test computer; if no, generating a warning message; or if yes, performing the next step;

(c) testing the electronic device;

(d) recording a test result of the electronic device according to the barcode number; and (e) generating a retest rate according to the test result. In the foregoing preferable implementation manner, in step (e), a first pass yield is generated according to the retest rate.

DETAILED DESCRIPTION OF THE PREFERRED EMBODIMENT

The advantages and features of the present invention and a method for implementing the present invention are described in details with reference to examples of embodiments and accompanying drawings to be more easily understood. However, the present invention may be implemented in different forms, and should not be construed as limited to only embodiments described herein. Conversely, for a person skilled in the art, the embodiments are provided for making the disclosure more thorough and comprehensive and completely conveying the scope of the present invention.

Figure 1A:
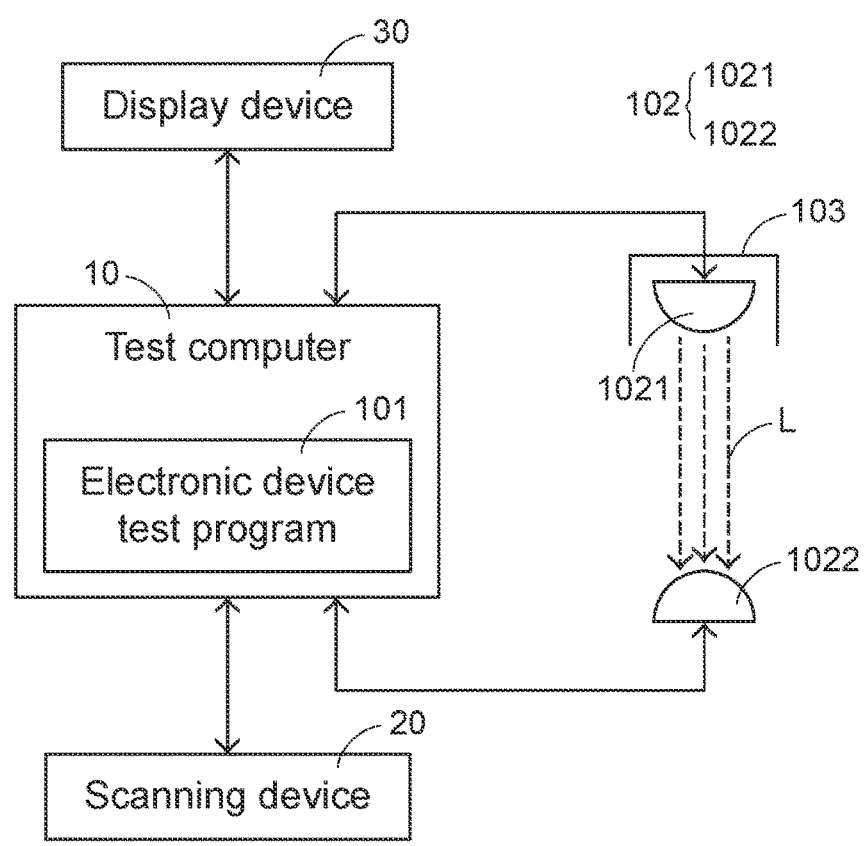
FIG. 1A and FIG. 1B show an electronic device test system provided in the present invention.
Figure 1B:
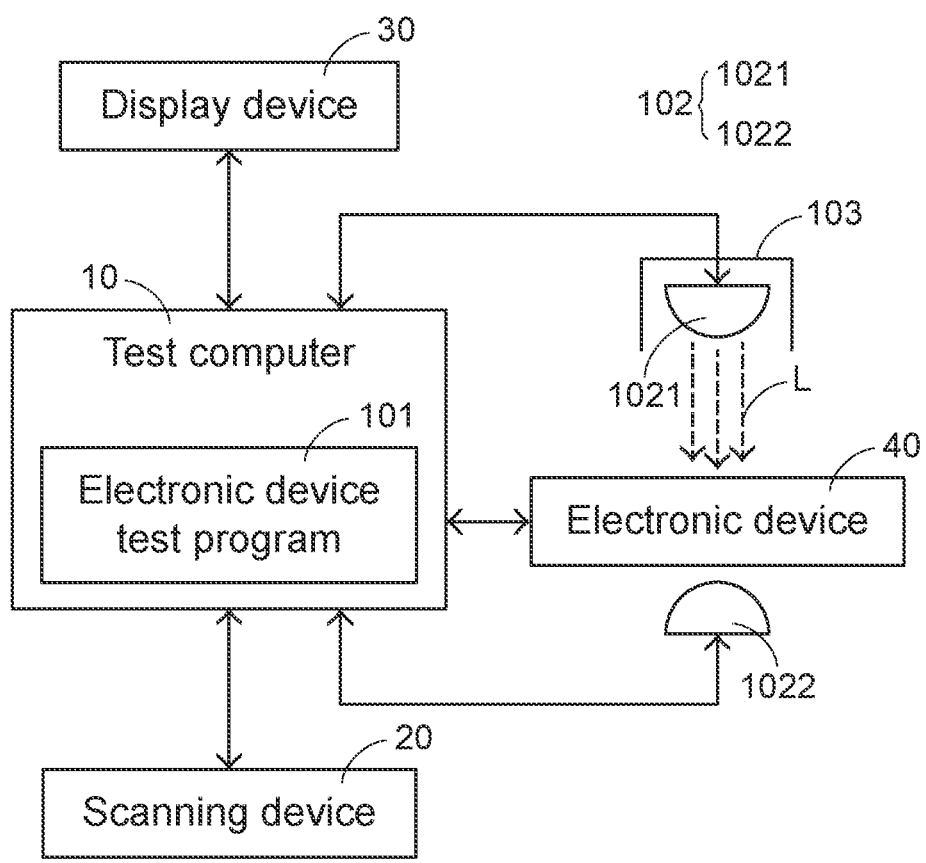

First, referring to FIG. 1A and FIG. 1B, FIG. 1A and FIG. 1B show an electronic device test system. In FIG. 1A and FIG. 1B, the electronic device test system installed in a production line test station includes: a test computer 10, a scanning device 20, and a display device 30. The test computer 10 is electrically connected to the scanning device 20 and the display device 30.

The test computer 10 may be a computer host provided with a Windows system or a Macintosh system. The test computer 10 is configured to install and execute an electronic device test program 101, and control, by using the electronic device test program 101, an optical sensor module 102 consisting of a light emitting element 1021 and a light receiving element 1022. The optical sensor module 102 may be disposed at a position of a connection port (not shown in the figure) of the test computer 10. The connection port of the test computer 10 is electrically connected to an electronic device 40. The optical sensor module 102 (including: the light emitting element 1021 and the light receiving element 1022) is configured to detect a connection status of the electronic device 40 and the test computer 10. The light emitting element 1021 is a light-emitting diode (LED) unit, and is configured to emit a light ray L to the light receiving element 1022. The light receiving element 1022 may be a photo transistor or an optical resistor. In addition, the light emitting element 1021 has a mask 103. The mask 103 is configured to maintain the light ray L in a stable traveling direction. The scanning device 20 is configured to scan a barcode number of the electronic device 40, to create a test record in the test computer 10. The display device 30 may be a liquid crystal display television or a liquid crystal display screen, and is configured to display a test record result of the electronic device 40. Only the implementation manner for detecting the connection status of the electronic device 40 and the test computer 10 by using the optical sensor module is provided in the present invention. However, in practical applications, another type of sensor module may be used to replace the optical sensor module. For example, a pressure sensor module may be used to replace the optical sensor module. The present invention is not limited to the optical sensor module.

Next, referring to FIG. 1B, after the scanning device 20 scans the barcode number of the electronic device 40 and creates the test record, the electronic device test program 101 immediately controls and starts the optical sensor module 102 consisting of the light emitting element 1021 and the light receiving element 1022. Subsequently, the electronic device 40 may be manually or automatically connected to the connection port of the test computer 10. When the electronic device 40 is connected to the test computer 10, because the electronic device 40 can simultaneously block the light ray L emitted by the light emitting element 1021, the light receiving element 1022 cannot receive the light ray L. Consequently, a resistance value of the light receiving element 1022 is increased. The electronic device test program 101 receives an electronic signal that is generated due to the increase in the resistance value of the light receiving element 1022. Therefore, it may be confirmed that the electronic device 40 is connected to the connection port of the test computer 10. The electronic device test program 101 immediately starts a test function, and tests, within a preset period of time, whether each functional element in the electronic device 40 can normally operate. Conversely, if the electronic device 40 is not correctly connected to the connection port of the test computer 10, the light receiving element 1022 may still keep receiving the light ray L, and therefore, the resistance value of the light receiving element 1022 is still maintained in a constant state, the electronic device test program 101 determines that the electronic device 40 is not connected to the connection port of the test computer 10. Consequently, the test function is not started. The electronic device 40 of the present invention may be: an electronic device having a universal serial bus (USB) interface connection port, such as a notebook computer, a tablet computer, a personal digital assistant, a mobile phone, a watch, a game console, a mouse, a keyboard, a screen, a printer, an office machine, a scanner, or a camera.

Figure 2:
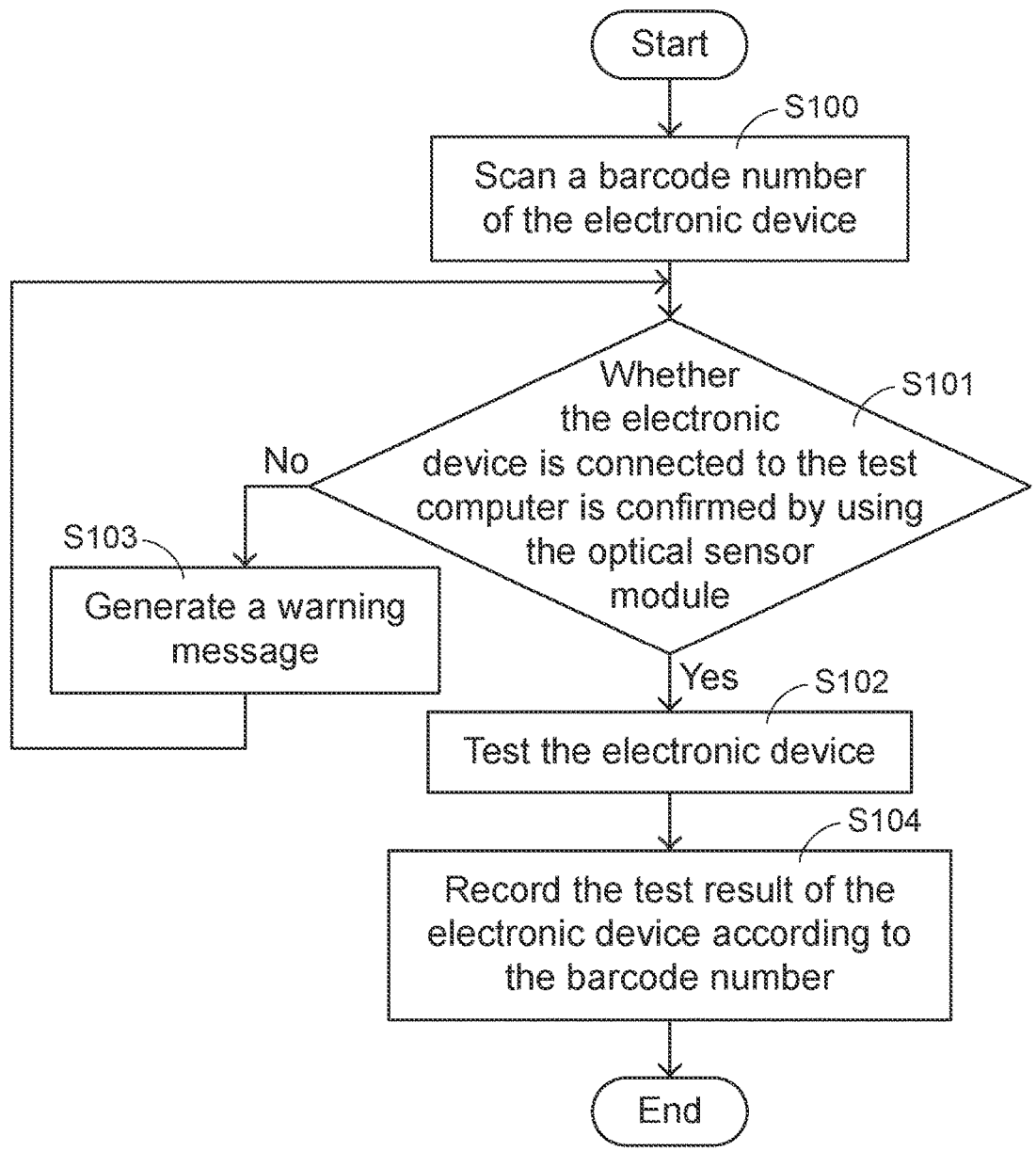
FIG. 2 is a flowchart of a test of an electronic device test system provided in the present invention.

Referring to FIG. 1B and FIG. 2 together, FIG. 2 shows a test process of the electronic device test system according to the present invention. First, the electronic device test system installed in the production line test station scans a barcode number of the electronic device 40 by using the scanning device 20 (step S100). In step S100, the scanning device 20 may be manually or automatically operated to scan the barcode number of the electronic device 40. In addition, data such as the test record is created by using the electronic device test program 101 in the test computer 10, and the test record and a test result are simultaneously displayed on a human-machine interface of the display device 30. Next, whether the electronic device 40 is connected to the test computer 10 is confirmed by using the optical sensor module 102 (the light emitting element 1021 and the light receiving element 1022) (step S101). In step S101, if the light ray L emitted by the light emitting element 1021 is not blocked by the electronic device 40, the electronic device test program 101 determines that the electronic device 40 is not correctly connected to the connection port of the test computer 10, and further generates a warning message (step S103). In step S103, the warning message may be displayed on the display device 30. In this case, the electronic device 40 may be manually or automatically reinstalled to be correctly connected to the test computer 10. In step S101, if the light ray L emitted by the light emitting element 1021 is blocked by the electronic device 40, and the electronic device test program 101 determines that the electronic device 40 is correctly connected to the connection port of the test computer 10, the electronic device test program 101 starts the test function, and tests the electronic device 40 within the preset period of time (step S102). In step S102, the preset period of time for testing the electronic device 40 may be set according to a type and a function to be tested of the electronic device 40. Finally, the electronic device test program 101 records the test result of the electronic device 40 according to the barcode number (step S104). In step S104, the electronic device test program 101 can record test information such as the barcode number of the electronic device 40, a connection confirmation status, and the test result in order, and displays such test information on the human-machine interface of the display device 30. A production line administrator can calculate a retest rate of the production line according to the test result, and then calculate a first pass yield of the production line according to the retest rate, thereby controlling operational performance of the production line.

Figure 3:
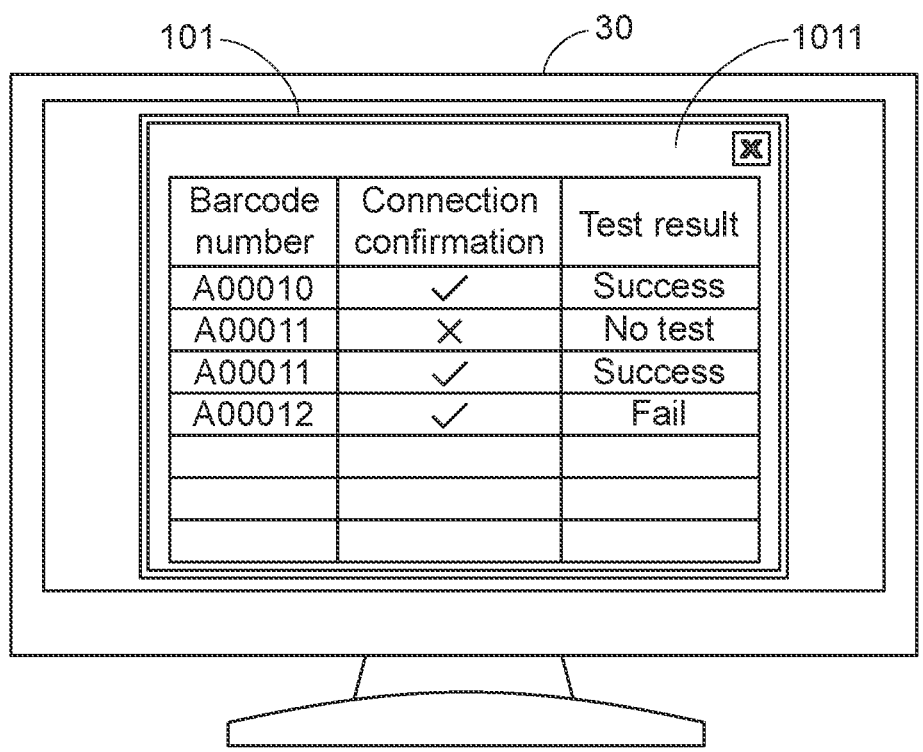
FIG. 3 is a schematic diagram of a display situation of a human-machine interface of an electronic device test system according to the present invention.

Referring to FIG. 1B and FIG. 3 together, FIG. 3 is a schematic diagram of a display situation of a human-machine interface of the electronic device test system according to the present invention. In FIG. 3, the display device 30 in the test station is configured to display a human-machine interface 1011 of the electronic device test program 101. Information displayed on the human-machine interface 1011 includes: the test data such as a barcode number, connection confirmation, and a test result, and a retest rate and a first pass yield of the test station may be calculated according to the test data. A calculation formula of the retest rate is: X/N*100%, where N is a quantity of tested electronic devices, and X is a difference between a quantity of test records and the quantity of the tested electronic devices. A calculation formula of the first pass yield is: 1−retest rate. If there are multiple test stations on one production line, a first pass yield of the production line is a product of first pass yields of the test stations on the production line. For example, connection confirmation of an electronic device 40 whose barcode number is 'A00010' is performed (displayed as ✓), and its test result is 'success'. Connection confirmation of an electronic device 40 whose barcode number is 'A00011' fails (displayed as X), and because the electronic device test program 101 does not start the test function, its test result is 'no test'. Then, the electronic device 40 whose barcode number is 'A00011' is manually or automatically rescanned and reinstalled to be correctly connected to the test computer 10. After its connection confirmation is completed (displayed as ✓), a test is performed again, and its test result is 'success'. Connection confirmation of an electronic device 40 whose barcode number is 'A00012' is performed (displayed as ✓), and its test result is 'fail'. In FIG. 3, a quantity of the tested electronic devices 40 is 3, and a quantity of test records is 4. Therefore, X is 1, and the retest rate is: ⅓*100%=33%. Because FIG. 3 is a single test station, the first pass yield is: 1−33%=67%.

Compared with conventional technologies, before an electronic device test system provided in the present invention performs a function test, a step of confirming connection of an electronic device and a test computer is added, so as to avoid an erroneous result that is generated when the electronic device is not correctly connected to the test computer during the test. In this way, the frequency of retesting the electronic device is reduced, thereby reducing consumption of energy and manpower costs. Moreover, a retest rate and a first pass yield of a production line or a test station is calculated according to a test result, so as to precisely monitor operational performance of the entire production line or test station, thereby effectively improving test accuracy of the electronic device and efficiency of automatic production. In addition, detection performed by using an optical sensor module does not cause any damage to the electronic device. Therefore, the present invention is an invention of high industrial value.

Any modification to the present invention made by a person skilled in the art does not depart from the protection scope defined by the appended claims.

What is claimed is:

1. An electronic device test system, configured to test functions of an electronic device, wherein the electronic device test system comprises:
    a test computer, configured to execute an electronic device test program;
    a scanning device, configured to scan a barcode number of the electronic device; and
    an optical sensor module, configured to detect a connection status of the electronic device and the test computer, wherein
    when the optical sensor module confirms the connection status, the electronic device test program starts a test function to test the electronic device, records a test result of the electronic device according to the barcode number, and subsequently generates a retest rate according to the test result.

2. The electronic device test system according to claim 1, wherein the electronic device test system further comprises a display device, configured to display a human-machine interface of the electronic device test program.

3. The electronic device test system according to claim 1, wherein the optical sensor module comprises a light emitting element and a light receiving element.

4. The electronic device test system according to claim 3, wherein the light emitting element further comprises a mask, configured to maintain a traveling direction of a light ray emitted by the light emitting element.

5. The electronic device test system according to claim 3, wherein the light receiving element is a photo transistor or an optical resistor.

6. The electronic device test system according to claim 1, wherein the electronic device has a universal serial bus interface connection port.

7. The electronic device test system according to claim 1, wherein the electronic device is: a notebook computer, a tablet computer, a personal digital assistant, a mobile phone, a watch, a game console, a mouse, a keyboard, a screen, a printer, an office machine, a scanner, or a camera.

8. An electronic device test method, used to test functions of an electronic device, wherein the electronic device test method comprises the following steps:
    (a) scanning a barcode number of the electronic device;
    (b) confirming, by using an optical sensor module, whether the electronic device is connected to a test computer; if no, generating a warning message; or if yes, performing the next step;
    (c) testing the electronic device;
    (d) recording a test result of the electronic device according to the barcode number; and
    (e) generating a retest rate according to the test result.

9. The electronic device test method according to claim 8, wherein in step (e), a first pass yield is generated according to the retest rate.

* * * * *